United States Patent [19]

Okagaki

[11] Patent Number: 4,904,860

[45] Date of Patent: Feb. 27, 1990

[54] OPTICAL SIGNAL DETECTION CIRCUIT WITH CONSTANT CURRENT SOURCES

[75] Inventor: Hiroyuki Okagaki, Tokyo, Japan

[73] Assignee: Clarion Co., Ltd., Tokyo, Japan

[21] Appl. No.: 234,480

[22] Filed: Aug. 19, 1988

[30] Foreign Application Priority Data

Aug. 28, 1987 [JP] Japan .................................. 62-216025

[51] Int. Cl.$^4$ .............................................. h01J 40/14
[52] U.S. Cl. ............................... 250/214 R; 250/214 A
[58] Field of Search ........ 250/214 R, 214 DC, 214 A, 250/214 SW, 551; 307/311; 455/619, 608

[56] References Cited

U.S. PATENT DOCUMENTS

| | | | |
|---|---|---|---|
| 3,770,956 | 11/1973 | Hanna et al. | 250/214 DC |
| 3,786,264 | 1/1974 | Ferro et al. | 250/214 R |
| 4,092,611 | 5/1978 | Frederiksen et al. | 250/214 A |
| 4,454,416 | 6/1984 | Gontowski, Jr. et al. | 250/214 A |
| 4,485,301 | 11/1984 | Gontowski, Jr. et al. | 250/214 A |
| 4,745,274 | 5/1988 | Muro | 250/214 R |
| 4,806,748 | 2/1989 | Takami et al. | 250/214 R |

Primary Examiner—David C. Nelms
Assistant Examiner—Michael Messinger
Attorney, Agent, or Firm—Flynn, Thiel, Boutell & Tanis

[57] ABSTRACT

An optical signal detecting circuit is configured so that its detection sensitivity for detecting an optical signal received by a light receiving element is set by selecting desired values of fixed current sources I and I' and a desired current division ratio of independent PNP multicollector transistors Q1 and Q2 and so that its optical signal detecting hysteresis range is set by selecting a desired current ratio of I and I' or a desired current division ratio of the independent PNP multicollector transistors Q1 and Q2.

10 Claims, 2 Drawing Sheets

FIG. 1
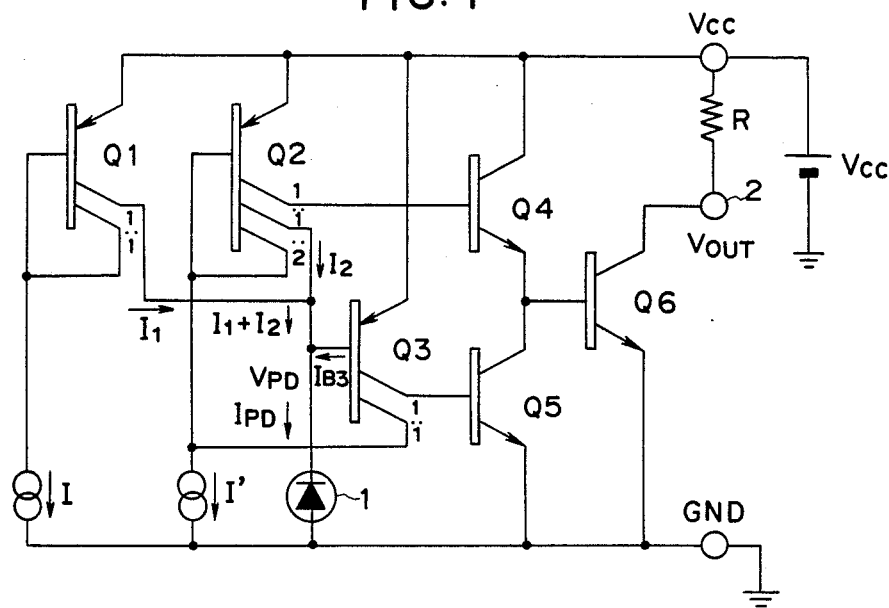
FIG. 2A
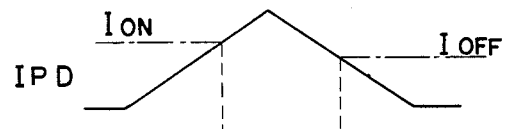
FIG. 2B
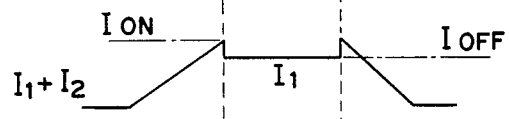
FIG. 2C
FIG. 2D
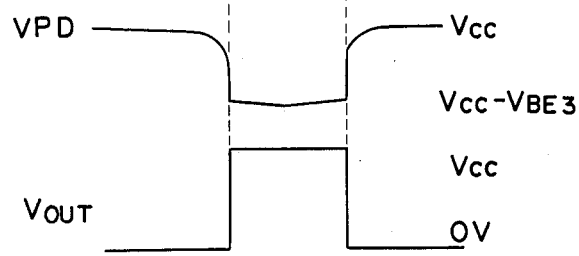

OPTICAL SIGNAL DETECTION CIRCUIT WITH CONSTANT CURRENT SOURCES

FIELD OF THE INVENTION

This invention relates to an optical signal detection circuit using a semiconductive light-receiving element to process, in particular, digital signals.

BACKGROUND OF THE INVENTION

FIG. 4 shows a circuit diagram of a prior art optical signal detection circuit in which reference numeral 1 refers to a light receiving element made from a photodiode or phototransistor, and 2 refers to an output terminal. A left half 11 of the diagram is a current-voltage conversion circuit including a differential amplifier AMP 1 and a resistor R, and a right half 12 of the diagram is a voltage comparator having a hysteresis and made from a resistor R and a differential amplifier AMP 2 supplied with a reference voltage (hereinafter called a "hysteresis comparator").

An optical signal is converted into an electrical signal by the light-receiving element 1 and is subsequently processed electrically. In general, when a photo diode is used as the light receiving element 1, optical-to-electrical signal conversion is performed using the nature that the diode current is proportional to the strength of light. However, since the diode current is very small, the detected current signal is amplified in a current-voltage converting circuit of FIG. 4. An optical current signal detected by the photo diode 1 is converted and amplified into a voltage signal of a sufficient level in the current-voltage converting circuit 11. Since the signal includes a noise component, it is converted into a digital signal without noises by the voltage comparator 12 having a hysteresis. That is, the prior art optical signal detection requires a current-voltage converter having a high gain and a hysteresis comparator, and this invites an increase in the number of circuit elements to form the detection circuit. Beside this, since the prior art circuit requires such a current-voltage converting circuit having a high gain to amplify a small light signal, the circuit itself becomes weak against electrical external noises or is apt to oscillate. Further, also when some sets of optical detection circuits are incorporated into a single IC, it is very difficult to remove varieties in sensitivity of respective detection circuits, and it is necessary to adjust gains of respective current voltage converting circuits. Therefore, the prior art circuit is not suitable for incorporating some such circuits into a single chip as an IC.

It is therefore an object of the invention to provide an optical signal detecting circuit having a small-scaled circuit arrangement and suitable for incorporating some detection circuits into a single IC.

SUMMARY OF THE INVENTION

According to the invention, there is provided an optical signal detecting circuit comprising:
a bias source ($V_{cc}$);
sensitivity setting circuits (Q1, Q2) interposed between said bias source and ground to output a predetermined current to set the sensitivity for detecting light;
a light receiving circuit (1) connected in series between said sensitivity setting circuits and ground;
a judging circuit (Q3) for detecting that said light receiving circuit has come to absorb said current from said sensitivity setting circuits; and
output circuits (Q4, Q5, Q6) responsive to the result of judgement of said judging circuit to change an output signal.

BRIEF DESCRIPTION OF THE DRAWINGS

FIG. 1 is a circuit diagram of an inventive optical signal detecting circuit;

FIGS. 2a, 2b, 2c, and 2d, show waveforms of signals at respective points of the detection circuit of FIG. 1;

DETAILED DESCRIPTION

Figure 3:
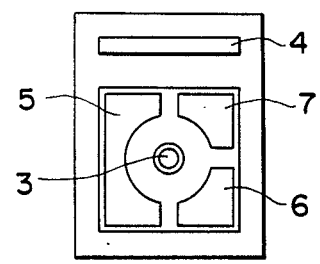
FIG. 3 is a plan view of a PNP multicollector transistor.

The invention is described below in a greater detail, referring to a preferred embodiment illustrated in the drawings. The illustration is not but an example, and the invention of course also involves various modifications and improvements without departing the scope thereof.

Figure 4:
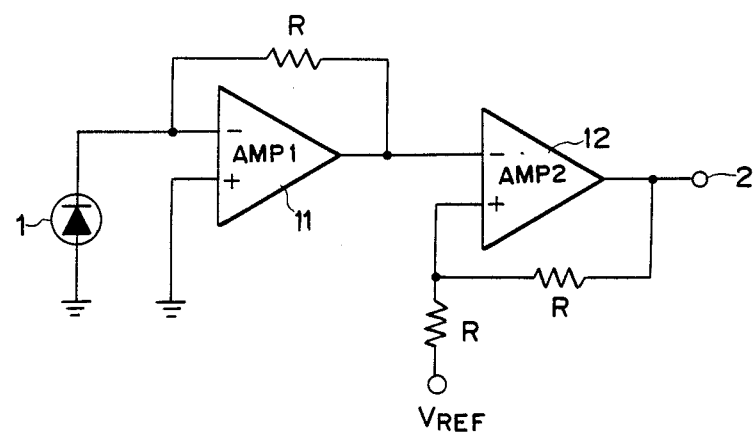
FIG. 4 is a circuit diagram of a prior art optical signal detecting circuit.

FIG. 1 is a circuit diagram of an inventive optical signal detecting circuit in which the same reference numerals as those in FIG. 4 denote the same or equivalent circuit members. Reference numerals Q1, Q2 and Q3 refer to PNP multicollector transistors, Q4, Q5 and Q6 denote NPN transistors, I designates a fixed current source, and I' refers to another current source of the same current value as the fixed current source I. FIG. 2 shows signal waveforms at respective points of the detecting circuit of FIG. 1, namely, the photodiode current $I_{PD}$ at (a), $I_1+I_2$ at (b), photodiode voltage $V_{PD}$ at (c) and output voltage $V_{out}$ at (d).

In FIG. 1, bases of the transistors Q1 and Q2 are connected to the fixed current sources I and I', and at least one collector and at least one emitter thereof are connected to each other to form a current mirror circuit. Transistors Q1 and Q2 make a sensitivity setting circuit interposed between a bias source $V_{cc}$ and a grounded terminal GND. The sensitivity setting circuit produces an output of a predetermined current to set the sensitivity for detecting light. The light receiving element 1 may be a photo diode connected between the other collector of the transistors Q1–Q2 and an intermediate point between the base of the transistor Q3 and the grounded terminal GND to form a light receiving circuit.

The base of the transistor Q3 is connected to the other collector of the transistor Q1 and Q2 and to the photo diode 1 to form a judging circuit which detects that the photodiode 1 has come to not absorb an output current from the collector of the transistors Q1 and Q2. Transistors Q4, Q5 and Q6 are responsive to a detection signal from the transistor Q3 to vary an output to be given to the output terminal 2.

The circuit of FIG. 1 operates as described below. The sensitivity for turning on and off the circuit upon application of light is set by selecting appropriate values of the fixed current sources I and I' and the division ratio of the collector current by the PNP multicollector transistors Q1 and Q2. Herebelow, respective currents divided by the transistors Q1 and Q2 are referred to as $I_1$ and $I_2$, and the fixed current sources I and I' are explained as being independent fixed current sources having the same current value and exhibiting the same characteristic. Further, assume here that the collector dividing ratio of the transistors Q1 and Q3 is 1:1, and the collector dividing ratio of the transistor Q2 is 2:1. Under this arrangement, current $I_1$ supplied from the transistor Q1 to the photodiode 1 equals I, and the current $I_2$ supplied from the transistor Q2 to the photodiode 1 is $0.5I'$. Further, since $I=I'$, $I_2=0.5I'$.

When no light is irradiated to the photo diode 1, no light current $I_{PD}$ flows in the photo diode 1. Therefore, the transistor Q3, with no current in the base thereof, is turned off, and the transistor Q5 is also off. At the same time, the transistor Q4 is turned on by the collector current from the transistor Q2, and the output transistor Q6 is turned on responsively. As a result, the output $V_{out}$ becomes a $V_{CE}$ (sat) voltage of the transistor Q6 (approximately 0V).

When the strength of light against the photo diode 1 increases gradually, the current in the photo diode 1 increases proportionally to the light strength as shown at (a) $I_{PD}$ in FIG. 2. The base current $I_{B3}$ of the transistor Q3 does not flow while the current value supplied from the transistors Q1 and Q2 is fully absorbed. More specifically, since $I_{B3}$ does not flow before the current value of $I_{PD}$ exceeds the threshold level of $I_1+I_2=1.5I$, the transistor Q3 is maintained off in the period. When and after $(I_1+I_2)-I_{PD}<I_{B3}$ is established, the transistor Q3 takes its on condition, and the emitter and the base of the transistor Q2 and the transistor Q2 are short-circuited so that the base current of the transistor Q2 does not flow. Therefore, $I_2$ does not flow, and the photo diode 1 is supplied with the fixed current value $I_1$ alone, so that the threshold level becomes $I_1=I$. Further, the collector current of the transistor Q3 turns on the transistor Q5, and by rapidly discharging the stored charge in the base of the transistor Q6, a high-speed switching of the transistor Q6 is established. As a result, the output voltage $V_{out}$ becomes the $V_{cc}$ value.

When the light against the photo diode 1 decreases gradually, the circuit operates as follows. When the transistor Q3 is once turned on, since the fixed current value supplied to the photo diode 1 drops from $I_1+I_2$ to $I_1$, the transistor Q3 is turned off when $I_{PD}$ decreases to $I_1-I_{PD}>I_{B3}$. When the transistor Q3 is turned off, the circuit exhibits the same configuration as that with no light irradiated to the photo diode 1. More specifically, transistor Q2 is turned on, photo diode 1 is supplied with $I_1+I_2$ current, transistor Q4 is turned on, transistor Q5 is turned off, output transistor Q6 is turned on, and output voltage $V_{out}$ drops to $V_{CE}$ (sat) voltage of the transistor Q6. Since the base current $I_{B3}$ of the transistor Q3 is expressed $I'/\beta 3$ approximately, when the current amplifying ratio $\beta 3$ of the transistor Q3 is sufficiently large, it is considered that $I_{B3}<<I'$. Therefore, the sensitivity for detecting a light signal and switching the circuit is determined by $I_1+I_2$ during its on-condition and by $I_1$ in its off-condition.

Therefore, all required to set the detection sensitivity in the inventive optical signal detecting circuit is to determine the fixed current values of I and I'. Apparently this facilitates setting and changing of the detection sensitivity. Further, by changing the collector-emitter opposed length ratio of the PNP multicollector transistor of FIG. 3 so as to change the current ratio of $I_1$ and $I_2$, setting of the hysteresis width for on/off switching can be changed as desired. In FIG. 3, reference numeral 3 refers to the emitter, 4 to the base, 5 to the first collector, 6 to the second collector and 7 to the third collector. In this case, since $I_1=I$, $I_2=0.5I$ are established, the on-off hysteresis width $\eta$ becomes $\eta=I_1/(I+I_2)=I/1.5I=0.67$.

As described above, the invention has the following advantages:

(i) the circuit is small-scaled with decreased circuit elements; (ii) power consumption is decreased; (iii) the circuit involves less instability such as oscillation, etc. because a small current signal is judged in its original, non-amplified form; (iv) the detection sensitivity level is set as desired by setting current values of I and I'; (v) the hysteresis width of the detection sensitivity level is set as desired by selecting a desired current ratio of I and I' or by selecting an appropriate collector-emitter opposed length ratio of the PNP multicollector transistors Q1 and Q2; (vi) since the circuit is small-scaled, a number of such detection circuits can be incorporated on a single chip, and differences in sensitivity of respective detection circuits can be decreased; and (vii) substantially no resistor is used for respective circuit elements, a further scale reduction of the circuit is expected.

What is claimed is:

1. An optical signal detecting circuit, comprising:
   first and second transistors which each have a base and a plurality of collectors, wherein a first of said collectors and said base of said first transistor are connected to each other and to a first constant current source, and wherein a first of said collectors and said base of said second transistor are connected to each other and to a second constant current source;
   a light receiving element having a first end connected to ground and a second end connected to a second of said collectors of each of said first and second transistors;
   a third transistor which has a base and a plurality of collectors, said base of said third transistor being connected to said second end of said light receiving element, and a first of said collectors of said third transistor being connected to said first collector of said second transistor;
   fourth and fifth transistors which each have an emitter, a base, and a collector, said emitter of said fifth transistor and said collector of said fourth transistor being respectively connected to ground and to a power source, said emitter of said fourth transistor being connected to said collector of said fifth transistor, said base of said fourth transistor being connected to a third of said collectors of said second transistor, and said base of said fifth transistor being connected to a second of said collectors of said third transistor; and
   a sixth transistor having a collector, an emitter, and a base which are respectively connected to an output terminal, to ground, and to said collector of said fifth transistor.

2. A circuit of claim 1, wherein said first, second and third transistors each have an emitter which is connected to said power source, wherein said light receiving element is a photodiode having an anode and cathode which are respectively said first and second ends thereof, and including a resistor having two ends respectively connected to said output terminal and said power source.

3. A circuit comprising: a first transistor having an emitter coupled to a first terminal, having first and second collectors, and having a base; a second transistor having an emitter coupled to said first terminal, having first and second collectors, and having a base; a first constant current source coupled at a first end to a second terminal and coupled at a second end to said base and said first collector of said first transistor; a third transistor having an emitter coupled to said first terminal, having a collector and having a base; a second constant current source coupled at a first end to said second terminal, and coupled at a second end to said base and said first collector of said second transistor and to said collector of said third transistor; a light sensitive element having a first end coupled to said second terminal and having a second end coupled to said base of said third transistor, to said second collector of said second transistor, and to said second collector of said first transistor; first means for creating a difference in electrical potential between said first and second terminals; and second means coupled to an output terminal and responsive to said third transistor being on and off for causing said output terminal to respectively have first and second electrical states.

4. A circuit of claim 3, wherein said third transistor has a further collector, and wherein said second means is coupled to said further collector of said third transistor.

5. A circuit of claim 4, wherein said second transistor has a third collector, and wherein said second means is coupled to said third collector of said second transistor.

6. A circuit of claim 5, wherein said second means includes a fourth transistor having a collector coupled to said first terminal, having a base coupled to said third collector of said second transistor, and having an emitter, and includes a fifth transistor having a collector coupled to said emitter of said fourth transistor, having a base coupled to said further collector of said third transistor, and having an emitter coupled to said second terminal.

7. A circuit of claim 6, wherein said second means includes a sixth transistor having a collector coupled to said output terminal, having a base coupled to said emitter of said fourth transistor, and having an emitter coupled to said second terminal, and includes a resistor having its ends respectively connected to said output terminal and said first terminal.

8. A circuit of claim 5, wherein for said first transistor a collector current dividing ratio is one to one for said first collector thereof with respect to said second collector thereof, wherein for said second transistor a collector current dividing ratio is two to one for said first collector thereof with respect to said second collector thereof and is two to one for said first collector thereof with respect to said third collector thereof, and wherein for said third transistor a collector current dividing ratio is one to one for said firstmentioned collector thereof with respect to said further collector thereof.

9. A circuit of claim 8, wherein a constant current through said first constant current source is equal to a constant current through said second constant current source.

10. A circuit of claim 3, wherein said light sensitive element is a photodiode having an anode and a cathode which are respectively said first and second ends thereof.

* * * * *